(12) United States Patent
Shu et al.

(10) Patent No.: US 9,709,745 B2
(45) Date of Patent: Jul. 18, 2017

(54) SINGLE FIBER BRAGG GRATING AS DELAY LINE INTERFEROMETER

(71) Applicant: HUAZHONG UNIVERSITY OF SCIENCE AND TECHNOLOGY, Wuhan, Hubei (CN)

(72) Inventors: Xuewen Shu, Hubei (CN); Miguel Angel Preciado, Fife (GB)

(73) Assignee: Huazhong University of Science and Technology, Wuhan, Hubei (CN)

( * ) Notice: Subject to any disclaimer, the term of this patent is extended or adjusted under 35 U.S.C. 154(b) by 0 days.

(21) Appl. No.: 14/786,821

(22) PCT Filed: Apr. 17, 2014

(86) PCT No.: PCT/GB2014/051214
§ 371 (c)(1),
(2) Date: Oct. 23, 2015

(87) PCT Pub. No.: WO2014/174256
PCT Pub. Date: Oct. 30, 2014

(65) Prior Publication Data
US 2016/0109657 A1    Apr. 21, 2016

(30) Foreign Application Priority Data
Apr. 24, 2013   (GB) .................................. 1307388.7

(51) Int. Cl.
*G02B 6/34* (2006.01)
*G02B 6/293* (2006.01)
(Continued)

(52) U.S. Cl.
CPC .......... *G02B 6/29353* (2013.01); *C03B 37/14* (2013.01); *G02B 6/02085* (2013.01);
(Continued)

(58) Field of Classification Search
CPC .................................................. G02B 6/29353
See application file for complete search history.

(56) References Cited

U.S. PATENT DOCUMENTS

| 6,292,282 B1* | 9/2001 | Mossberg ............ G02B 6/2861 398/87 |
| 6,657,786 B2* | 12/2003 | Levner ................... G02B 6/124 359/559 |
| 2016/0109657 A1* | 4/2016 | Shu ..................... G02B 6/02085 385/37 |

FOREIGN PATENT DOCUMENTS

CN    1752781    3/2006

OTHER PUBLICATIONS

Miguel A Preciado et al: "Proposal and design of phase-modulated fiber gratings in transmission for pulse shaping", Optics Letters, Optical Society of America, US, vol. 38, No. 1, Jan. 1, 2013 (Jan. 1, 2013), pp. 70-72.*

(Continued)

*Primary Examiner* — Rhonda Peace
(74) *Attorney, Agent, or Firm* — Hamre, Schumann, Mueller & Larson, P.C.

(57) ABSTRACT

A delay line interferometer comprising an optical waveguide having a distributed Bragg reflector, e.g. Bragg grating, fabricated therein. The distributed Bragg reflector has a refractive index modulation with a period variation Λ(z) along its length z that is arranged to output in transmission an output optical signal $f_{out}(t)$ in response to a input optical signal $f_{in}(t)$, wherein the output optical signal $f_{out}(t)$ is the result of temporal interference between one or more time-delayed replicas of the input optical signal $f_{in}(t)$. In other words, the distributed Bragg reflector is operable to generate and permit temporal interference between two or more (Continued)

time-delayed replicas of the input optical signal $f_{in}(t)$. The invention may thus mimic the behaviour of one or more MZIs.

13 Claims, 3 Drawing Sheets

(51) Int. Cl.
  *G02B 6/02* (2006.01)
  *G02B 6/28* (2006.01)
  *C03B 37/14* (2006.01)
  *G03F 1/26* (2012.01)

(52) U.S. Cl.
  CPC ....... *G02B 6/02138* (2013.01); *G02B 6/2861* (2013.01); *G02B 6/29356* (2013.01); *G03F 1/26* (2013.01); *G01B 2290/25* (2013.01); *G02B 2006/02166* (2013.01)

(56) References Cited

OTHER PUBLICATIONS

Rivas L M et al: "Experimental demonstration of ultrafast all-fiber high-order photonic temporal differentiators", Optics Letters, Optical Society of America, US, vol. 34, No. 12, Jun. 15, 2009 (Jun. 15, 2009), pp. 1792-1794.*

Miguel A. Preciado et al: "Ultrafast all-optical Nth-order differentiator and simultaneous repetition-rate multiplier of periodic pulse train", Optics Express, vol. 15, No. 19, Sep. 17, 2007 (Sep. 17, 2007), pp. 12102-12107.*

Miguel A Preciado et al: "Pulse shaping by phase-modulated fiber gratings in transmission", Optical Fiber Communication Conference and Exposition and the National Fiber Optic Engineers Conference (OFC/NFOEC), 2013, pp. 1-3.*

Miguel A Preciado et al: "Virtual delay line interferometer by a transmissive phase-modulated fiber Bragg grating", 39th European Conference and Exhibition on Optical Communication (ECOC 2013), 2013, p. 1-3.*

International Search Report from PCT/GB2014/051214 mailed Jul. 1, 2014, 3 pages.

Preciado, Miguel k et al. "Proposal and design of phase-modulated fiber gratings in transmission for pulse shaping", Optics Letters, Optical Society of America. vol. 38, No. 1 (2012) Jan. 1, 2013, pp. 70-72.

Rivas, Luis M. et al. "Experimental demonstration of ultrafast all-fiber high-order photonic temporal differentiators", Optics Letters, Optical Society of America. vol. 34, No. 12, Jun. 15, 2009, pp. 1792-1794.

Preciado, Miguel k et al. "Ultrafast all-optical Nth-order differentiator and simultaneous repetition-rate multiplier of periodic pulse train", Optics Express. vol. 15, No. 19, Sep. 17, 2007, pp. 12102-12107.

Lim, Jong H. et al., "Mach-Zehnder interferometer formed in a photonic crystal fiber based on a pair of long-period fiber gratings," Optics Letters, Optical Society of America. vol. 29, No. 4 Feb. 15, 2004 [retrieved from the internet on Oct. 12, 2016], retrieved at: <https://www.researchgate.net/publication/7228627>, pp. 346-348.

Du, Jiangbing, et al. "Photonic crystal fiber based Mach-Zehnder interferometer for DPSK signal demodulation", Optics Express. vol. 18, No. 8, Apr. 12, 2010, pp. 7917-7922.

Allsop, T. et al., "A high sensitivity refract meter based upon a long period grating Mach-Zehnder interferometer", Review of Scientific Instruments. vol. 73, No. 4, Apr. 2002. [Retrieved from the internet on Oct. 12, 2016 at: <https://www.researchgate.net/publication/228600122>, pp. 1702-1705.

Liao, C. R., et al. "Fiber In-Line Mach-Zehnder Interferometer Embedded in FBG for Simultaneous Refractive Index and Temperature Measurement", IEEE Photonics Technology Lettters. vol. 22, No. 22, Nov. 15, 2010, pp. 1686-1688.

Skaar, Johannes, "Synthesis of fiber Bragg gratings for use in transmission", Optical Society of America. vol. 18, No. 3, Mar. 2001, pp. 557-564.

Feced, Ricardo, "An Efficient Inverse Scattering Algorithm for the Design of Nonuniform Fiber Bragg Gratings", IEEE Journal of Quantum Electronics. vol. 35, No. 8, Aug. 1999, pp. 1105-1115.

\* cited by examiner

SINGLE FIBER BRAGG GRATING AS DELAY LINE INTERFEROMETER

FIELD OF THE INVENTION

The invention relates to the use of delay line interferometers, such as Mach-Zehnder interferometers (MZIs) in performing temporal interference of time-delayed replicas of an input optical signal. In particular, the invention relates to an in-fibre implementation of a delay line interferometer corresponding to one or more MZI structures.

BACKGROUND TO THE INVENTION

A Mach-Zehnder interferometer (MZI) constitutes a basic optical block in many optical systems, for diverse areas of applications ranging from optical communications, metrology or sensing. A number of articles have reported the possibility of provided an in-fibre MZI [1-4].

SUMMARY OF THE INVENTION

At its most general, the invention provides a delay line interferometer comprising an optical waveguide having a distributed Bragg reflector, preferably a Bragg grating, fabricated therein, the distributed Bragg reflector having a refractive index modulation with a period variation $\Lambda(z)$ along its length z that is arranged to output in transmission an output optical signal $f_{out}(t)$ in response to a input optical signal $f_{in}(t)$, wherein the output optical signal $f_{out}(t)$ is the result of temporal interference between one or more time-delayed replicas of the input optical signal hop. In other words, the distributed Bragg reflector is operable to generate and permit temporal interference between two or more time-delayed replicas of the input optical signal $f_{in}(t)$. The invention may thus mimic the behaviour of one or more MZIs.

Preferably, the invention uses a transmissive Bragg grating (i.e. a short period grating) as the distributed Bragg reflector. Here the desired interference functionality is obtained as a type of spectral filtering based on minimum phase conditions, as explained below. This may be in contrast to other types of distributed Bragg reflector interference functionality, where the output signal may be the result of interference between two co-propagating modes, for example. Thus, references herein to a "delay line interferometer" are to be interpreted as a device whose an output signal is consistent with the functionality associated with a conventional delay line interferometer, without being bound to operate strictly in the same manner.

In one example, the invention provides an implementation of an in-fibre MZI based on a single phase-modulated fibre Bragg grating (FBG) that operates in transmission. Thus the optical waveguide defined above may be an optical fibre, and the distributed Bragg reflector defined above may be a fibre Bragg grating (FBG), preferably a phase-modulated FBG. Thus, in one embodiment, the invention may provide an optical fibre having a phase-modulated fibre Bragg grating (FBG) fabricated therein, the phase-modulated FBG having a grating period variation $\Lambda(z)$ along its length z that is arranged to output in transmission an output optical signal $f_{out}(t)$ in response to a input optical signal $f_{in}(t)$, wherein the output optical signal $f_{out}(t)$ is the result of temporal interference between one or more time-delayed replicas of the input optical signal $f_{in}(t)$.

The invention may be used to mimic the behaviour of one or more suitably configured MZIs by performing temporal interference of one or more replicas of an input optical signal, where the one or more replicas are time-delayed with respect to one another. By implementing the MZI functionality in an optical fibre, the invention may enable the fabrication of a compact delay line interferometer, since separate mirrors and beam splitters can be dispensed with. Moreover, the invention can ameliorate the insertion loss associated with delivering an output optical signal from a separate MZI apparatus into an optical waveguide, e.g. an optical fibre. The invention can be applied to any kind of input optical signal. In one example, it may be used to generate trains of time-spaced pulses from a single input pulse.

An advantage of using a transmissive FBG (also referred to as a short period FBG) compared with a FBG operating in reflection is that an optical circulator for extracting the output of the FBG is not required. Similarly, a transmissive FBG is advantageous compared with a long period grating (LPG) because it presents a simpler output signal that two co-directional modes in the LPG's output.

Transmissive FBGs may also be optimal in energy efficiency terms due to the fact that the mode (and direction) of the output signal is the same as that of the input signal. Moreover, it is known that the phase response of transmissive FBGs is less sensitive to grating fabrication errors [5].

Herein, a replica of the input optical signal $f_{in}(t)$ may mean an optical signal having substantially the same profile (shape) as the input optical signal. The phrase "time-delayed" means that the two or more replicas of the input optical signal which are caused to interfere with each other are spaced from each other in the temporal domain.

The phrase "temporal interference" may mean the process of summing the electric field components of the time-delayed replicas of the input optical signal $f_{in}(t)$. In one embodiment, the input optical signal may be a single optical pulse. If the time delay between the replicas of the optical pulse generated in the phase-modulated FBG are greater than the pulse width, the output optical signal may comprise a time-spaced series of two or more optical pulses, wherein each optical pulse is a replica of the input single optical pulse. The phase-modulated FBG may thus mimic the behaviour of one or more MZIs arranged to generated a train of optical pulses by splitting a single input pulse into a time-spaced series of two or more optical pulses.

Herein, $f_{in}(t)$ is used to designate a function that represents the input optical signal. The input optical signal may have any form, e.g. a long digital signal or a single input pulse, e.g. having a Gaussian profile. In the examples, below it is a 5 ps FWHM Gaussian optical pulse. Similarly, $f_{out}(t)$ is used herein to designate a function that represents the result of temporal interference between two or more time-delayed replicas of the input optical signal, i.e. $f_{out}(t)=\Sigma_{n=0}^{N-1}\alpha_n f_{in}(t-nT)$. For this, the distributed Bragg reflector (e.g. the phase-modulated FBG) is preferably arranged to exhibit an impulse response defined as $h_T(t)=\Sigma_{n=0}^{N-1}\alpha_n\delta(t-nT)$, where $f_{out}(t)=f_{in}(t)\otimes h_T(t)$. In the examples below, the impulse response is arranged to cause $f_{out}(t)$ to be a set of multiple pulses that are temporally separated (distinct) from each other. In these examples, the optical pulses in the time-spaced series are preferably substantially identical to each other. Preferably they also each have the same shape as the single input pulse.

The optical fibre may be arranged to support the propagation of optical radiation between an input portion for receiving the input optical signal $f_{in}(t)$ and an output portion for transmitting the output optical signal $f_{out}(t)$, wherein the phase-modulated FBG is fabricated, e.g. inscribed, in the optical fibre between the input portion and the output portion.

The optical fibre may be of any conventional type, e.g. comprising a core having a first refractive index, and a cladding layer surrounding the core, the cladding layer having a second refractive index, the second refractive index being lower than the first refractive index. The phase-modulated FBG may comprise a refractive index modulation inscribed in the core. The refractive index modulation may be confined within the core. The grating period variation $\Lambda(z)$ may correspond to the change in phase of the refractive index modulation across the grating. Herein, $\Lambda(z)$ may designate a function from the grating period variation. The grating period variation $\Lambda(z)$ may be a numerical function obtained by optimising a simulated spectral response for the phase-modulated FBG.

The phase-modulated FBG may have a substantially uniform coupling strength amplitude $|\kappa(z)|$ along its length. For example, the coupling strength amplitude $|\kappa(z)|$ may be defined as raised cosine function with a roll-off factor of 10%. The coupling strength is established and controlled during fabrication (e.g. inscription) of the phase-modulated FBG, e.g. based on one or more of (i) the speed at which the inscribing laser is scanned, (ii) the power of the inscribing laser, and (iii) the grating fringe visibility within the fibre during inscription.

A particular advantage of the invention is that a single transmissive phase-modulated FBG can mimic the behaviour of multiple MZIs. In other words, the phase-modulated FBG may be arranged to perform temporal interference between more than two time-delayed replicas of the input optical signal $f_{in}(t)$. Obtaining more than two time-delayed replicas of an input signal would otherwise require a lattice-type MZI structure. In the specific examples given below, this means that the grating period variation $\Lambda(z)$ may be arranged to output in transmission a time-spaced series of three or more optical pulses in response to a single input pulse.

The present invention is based on the realisation that if a desired interference functionality to be exhibited by a distributed Bragg reflector can be expressed as an impulse response $h_T(t)$ that is a minimum phase function, a unique complex spectral response for the distributed Bragg reflector (e.g. phase-modulated FBG) can be derived from the amplitude (i.e. magnitude) of a Fourier transform $|H_T(\omega)|$ of the impulse response $h_T(t)$. This process works because transmissive FBGs can be designed to simultaneously obtain the desired amplitude and phase spectral response because the spectral phase response is uniquely related to the transmission amplitude by the Hilbert transform [5]. This relationship is used in designing and fabricating the phase-modulated FBGs, as discussed below.

Thus, according to another aspect of the invention, there may be provided a method of fabricating a phase-modulated fibre Bragg grating (FBG) for a delay line interferometer, the method comprising: obtaining an objective spectral response $|H_{T,obj}(\omega)|$ that is a Fourier transform of an objective impulse response $h_{T,obj}(t)$ of the phase-modulated FBG, where the objective impulse response corresponds to a minimum phase system; selecting a coupling strength $|\kappa(z)|$ to be exhibited by the phase-modulated FBG along its length z; calculating a grating period variation $\Lambda(z)$ for the phase-modulated FBG using the objective spectral response $|H_{T,obj}(\omega)|$ and the coupling strength $|\kappa(z)|$; and inscribing a refractive index modulation having the grating period variation $\Lambda(z)$ in an optical fibre, whereby the phase-modulated FBG is operable in transmission to output an output optical signal $f_{out}(t)$ in response to an input optical signal $f_{in}(t)$. The method thus combines a numerical routine, e.g. carried out by a computer, for determining the grating period variation $\Lambda(z)$ with a physical inscribing step to create the phase-modulated FBG.

The objective spectral response $|H_{T,obj}(\omega)|$ may be obtained by performing a calculation on a provided function for the objective impulse response $h_{T,obj}(t)$. Alternatively, the objective spectral response $|H_{T,obj}(\omega)|$ may be directly provided to the process, e.g. from a look up table or a previously determined Fourier transform.

Calculating the grating period variation $\Lambda(z)$ for the phase-modulated FBG may include performing an iterative numerical optimisation process to bring a calculated spectral response $|H_{T,obj}(\omega)|$ towards the objective spectral response $|H_{T,obj}(\omega)|$. A similar numerical optimisation process has been disclosed for determining the spectral response $|H_T(\omega)|$ of a phase-modulated FBG for pulse shaping [6]. Thus, the iterative numerical optimisation process may include: obtaining the calculated spectral response $|H_T(\omega)|$ from the coupling strength $|\kappa(z)|$ and a candidate grating period variation function $\Lambda_i(z)$, calculating an error between the calculated spectral response $|H_T(\omega)|$ and the objective spectral response $|H_{T,obj}(\omega)|$, and selecting the next candidate grating period variation function $\Lambda_{i+1}(z)$ based on the error between the calculated spectral response $|H_T(\omega)|$ and the objective spectral response $|H_{T,obj}(\omega)|$.

Inscribing the refractive index modulation may be performed by any conventional method, e.g. irradiating the optical fibre with ultraviolet radiation through a phase mask. The phase mask may be customized for a particular purpose, i.e. it may have the grating period variation $\Lambda(z)$ encoded thereon. Alternatively, the phase-modulated FBG may be fabricated by a generic phase mask, using a pitch by pitch method where the coupling coefficient profile and the varied period can be realized by appropriately controlling the ON/OFF of an acousto-optic modulator and moving the phase mask/fibre.

Similarly to the first aspect of the invention, the method may be used to fabricate a phase-modulated FBG that mimics the function of a plurality of MZI, e.g. connected in a lattice. Thus, the objective spectral response $|H_{T,obj}(\omega)|$ may be a Fourier transform of a time-spaced series of three or more optical pulses.

The phase mask through which the inscribing UV radiation is transmitted may be yet another aspect of the invention. This aspect may provide a method of fabricating a phase mask for inscribing a phase-modulated fibre Bragg grating (FBG) in an optical fibre, the method comprising: obtaining an objective spectral response $|H_{T,obj}(\omega)|$ that is a Fourier transform of an objective impulse response $h_{T,obj}(t)$ of the phase-modulated FBG, where the objective impulse response corresponds to a minimum phase system; selecting a coupling strength $|\kappa(z)|$ to be exhibited by the phase-modulated FBG along its length z; calculating a grating period variation $\Lambda(z)$ for the phase-modulated FBG using the objective spectral response $|H_{T,obj}(\omega)|$ and the coupling strength $|\kappa(z)|$; and fabricating a phase mask, whereby the grating period variation $\Lambda(z)$ is encoded across the phase mask. Preferably the desired output optical signal $f_{obj}(t)$ is a time-spaced series of two or more, or three or more optical pulses. The phase mask may be fabricated using known techniques, such as electron beam lithography and holographic methods.

BRIEF DESCRIPTION OF THE DRAWINGS

Examples of the invention are discussed in detail below with reference to the accompanying drawings, in which.

DETAILED DESCRIPTION; FURTHER OPTIONS AND PREFERENCES

Figure 1A:
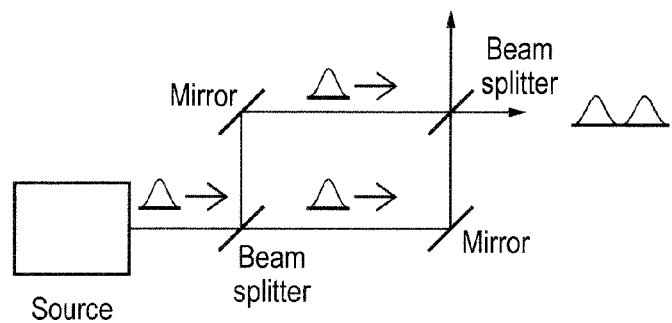
FIGS. 1A, 1B and 1C are schematic diagrams depicting known MZI configurations.
Figure 1B:
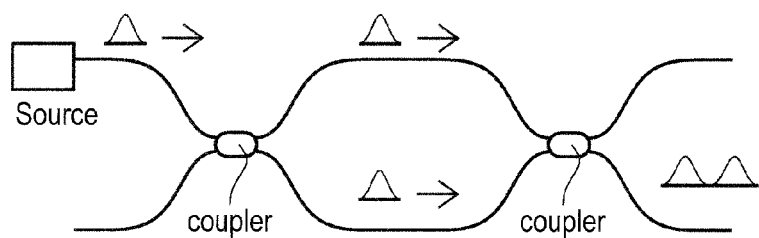
Figure 1C:
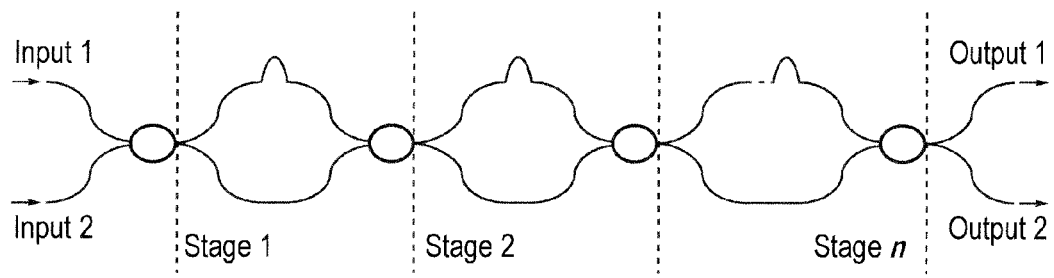

FIGS. 1A, 1B and 1C illustrate various known configurations for MZIs.

FIG. 1A shows a traditional MZI in which an input signal from a source is divided by a beam splitter. The two paths are recombined using mirrors at another beam splitter. The optical path lengths of the two paths are arranged to be slightly different so that a pair of replica input signals is output from the second beam splitter.

FIG. 1B shows a MZI arrangement implemented using a pair of optical fibres extending between two couplers. This arrangement operates in the same way as FIG. 1A, in that the optical path lengths of the two optical fibres between the couplers is arranged to be different, so that an input signal introduced to the optical fibres at the first coupler takes longer to propagate through one of the optical fibres relative to the other, so that the output from the second coupler comprises two time delayed replicas of the input signal.

FIG. 1C is a schematic diagram illustrating a lattice-type MZI structure, where a plurality of MZIs are arranged in a series of stages to generate multiple replicas from an original input signal.

Figure 2:
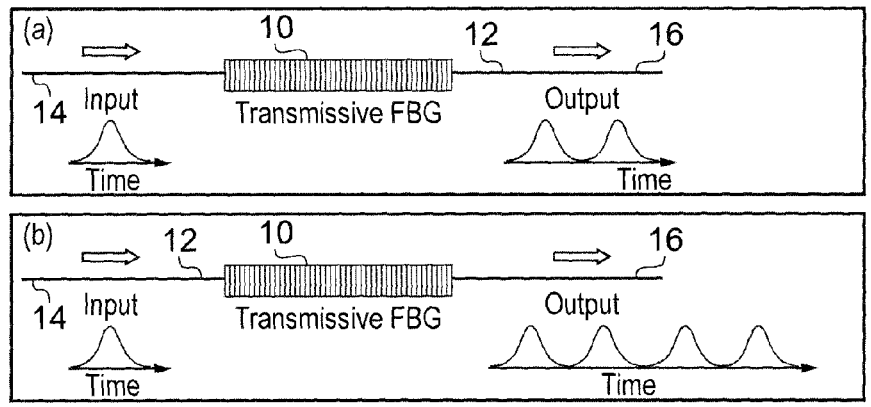
FIG. 2 is a schematic diagram depicting two embodiments of a delay line interferometer that are embodiments of the invention.

FIG. 2 illustrates schematically two examples of an delay line interferometer which are embodiments of the invention. Instead of physically splitting the input pulse, as in the traditional arrangements discussed above, the invention uses a suitably configured transmissive FBG 10 fabricated within an optical fibre 12 to provide the desired interference functionality.

The optical fibre 12 may be of any conventional type, e.g. made of silica and having a core for supporting propagation of optical radiation surrounded by a cladding layer. The transmissive FBG 10 may be inscribed within the core. The transmissive FBG 10 shown in FIG. 2 is not to scale—it is shown schematically for illustration purposes only.

As shown in FIG. 2, each embodiment has a input portion 14 for receiving input optical radiation. The input optical radiation is in the form of single pulses, e.g. having a Gaussian-like profile, generated by an optical source (not shown). Although the examples use a single pulse as an optical input signal, the present invention can be use with any type of optical input signal from any kind of optical source. For example, the input optical signal may be a digital signal having information encoded therein. However, for the specific example of pulse train generation discussed here, the optical source may for example be a mode-locked laser. Each embodiment also has an output portion 16 for delivered the optical radiation that is transmitted through the transmissive FBG 10, i.e. the optical pulse train. Since each embodiment operates in transmission, there is no need for an optical circulator or other filtering mechanism to extract the output signal.

The embodiment in FIG. 2(a) is arranged to output a pair of time-spaced optical pulses, each being substantially identical to the single input pulse. The embodiment in FIG. 2(b) is arranged to output a train of multiple pulses (four are shown in the drawing). Again, each pulse is substantially identical to the single input pulse.

In each embodiment, the transmissive FBG is a phase-modulated FBG, where the coupling strength remains substantially uniform in the grating. In practice, the phase-modulation profile can be directly encoded on a phase mask, which means the transmissive FBG can be reproduced with very high accuracy. The invention is based on the realisation that a single phase-modulated FBG operating in transmission is very suitable for implementing the function of one or more MZIs, since it can very accurately reproduce the corresponding spectral response.

The theory underlying the invention is now explained. Let us suppose $f_{in}(t)$ and $f_{out}(t)$ are the complex envelopes of the input and output of the transmissive FBG respectively, with t as the time variable. Since a transmissive FBG can be considered a linear system, the input and output are related by $f_{out}(t) = f_{in}(t) \otimes h_T(t)$, where $h_T(t)$ is the impulse response of the transmissive FBG, $\otimes$ denotes the convolution operator, and $\propto$ denotes proportionality. The corresponding spectral functions are related by $F_{out}(\omega) = F_{in}(\omega) H_T(\omega)$, where $\omega$ is the base-band angular pulsation, i.e., $\omega = \omega_{opt} - \omega_0$, where $\omega_{opt}$ is the optical angular pulsation and $\omega_0$ is the central angular pulsation of the signals, $F_{out}(\omega) = FT[f_{out}(t)]$ and $F_{in}(\omega) = FT[f_{out}(t)]$ are the output and input signal in the spectral domain, and $H_T(\omega) = FT[h(t)]$ is the spectral response of the transmissive FBG, where $FT[\cdot]$ denotes the Fourier transform.

To obtain a desired functionality corresponding to N delayed replicas temporally overlapping, an objective impulse response is expressed as $h_{T,obj}(t) = \Sigma_{n=0}^{N-1} \alpha_n \delta(t - nT)$, whose corresponding spectral response is $H_{T,obj}(\omega) = FT[h_{T,obj}(T)] = \Sigma_{n=0}^{N} \alpha_N \exp(-j\omega nT)$.

To achieve this functionality in practice, the spectral response of the FBG in transmission must meet $H_T(\omega) \simeq H_{T,obj}(\omega)$. In general, we cannot simultaneously impose $|H_T(\omega)|$ and $\angle H_T(\omega)$, since they are related by means of the logarithmic Hilbert transform (LHT) [5] in a transmissive FBG. However, both the amplitude and the phase of the spectral response objective, $H_{T,obj}(\omega)$, can be simultaneously obtained if $h_{T,obj}(t)$ is a minimum phase function.

The above theory is illustrated by way of the following examples.

As a first example, we consider a single MZI operation. In this example, the desired interference functionality of the phase-modulated FBG corresponds to a selection of N=2, $\alpha_0 = \alpha_1 = \frac{1}{2}$ and an interferometer delay T=20 ps in the above formula for the objective impulse response $h_{T,obj}(t)$. This function is a minimum phase function, since the corresponding system and its inverse are causal and stable.

Figure 3A:
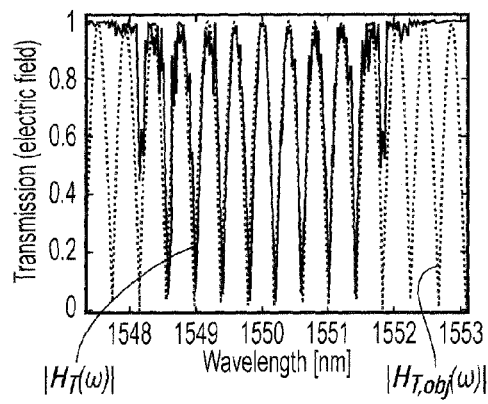
FIGS. 3A, 3B and 3C are graphs depicting objective and simulated spectral response amplitudes and a corresponding grating period variation associated with a delay line interferometer that is a first embodiment of the invention.

FIG. 3A is a graph showing an objective spectral response amplitude $|H_{T,obj}(\omega)|$ as a dotted line and a simulated actual spectral response amplitude $|H_T(\omega)|$ as a solid line. The objective spectral response amplitude $|H_{T,obj}(\omega)|$ is obtained from the Fourier transform of the objective impulse response $h_{T,obj}(t)$ The simulated actual spectral response amplitude $|H_T(\omega)|$ is obtained from the numerical optimization process discussed below.

Figure 3B:
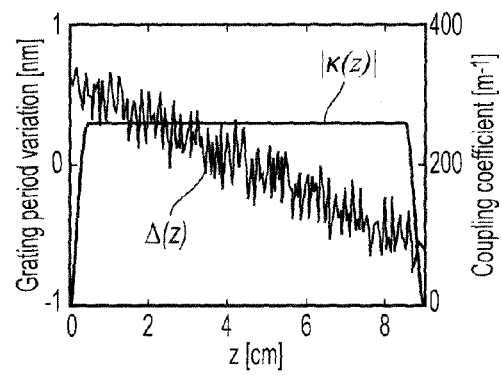

FIG. 3B shows the grating period variation $\Lambda(z)$ and the coupling coefficient $|\kappa(z)|$ for a phase-modulated FBG that exhibits the desired interference functionality. The phase-modulated FBG has a length of 9 cm, and the coupling coefficient $|\kappa(z)|$ is a raised cosine function with a roll-off factor of 10% and maximum amplitude 258.2 m$^{-1}$. The grating period variation $\Lambda(z)$ is obtained from the numerical optimization process discussed below.

Figure 3C:
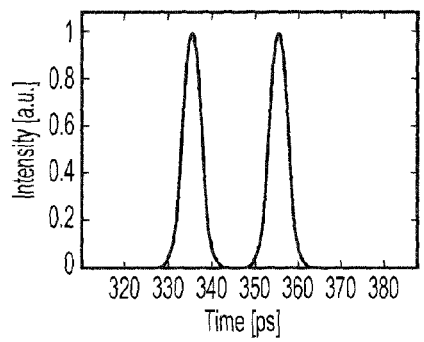

FIG. 3C shows the simulated output of the grating in response to a single 5 ps FWHM Gaussian input pulse centred on 1550 nm. It can be seen that the phase-modulated FBG acts to generate a pair of output pulses having the same profile as the input pulse. Clearly, in this example the output is a time-spaced pair of replicas of the input signal. Choosing a longer input signal will cause the time-delayed replicas to interfere with each other.

As a second example, we consider a multiple MZI operation. In this example, the desired interference functionality of the phase-modulated FBG corresponds to a selection of N=4, $\alpha_0=\alpha_1=\alpha_2=\alpha_3=\frac{1}{4}$ and an interferometer delay T=20 ps in the above formula for the objective impulse response $h_{T,obj}(t)$. This function is a minimum phase function, since the corresponding system and its inverse are causal and stable.

Figure 4A:
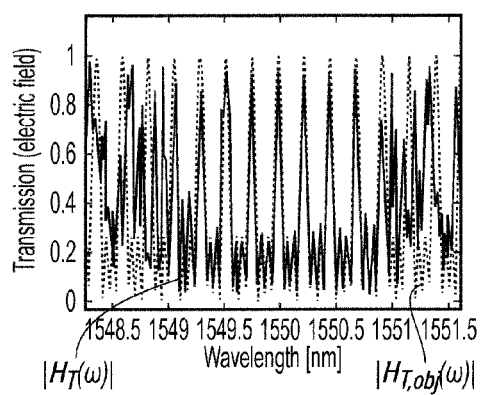
FIGS. 4A, 4B and 4C are graphs depicting objective and simulated spectral response amplitudes and a corresponding grating period variation associated with a delay line interferometer that is a second embodiment of the invention.

FIG. 4A is a graph showing an objective spectral response amplitude $|H_{T,obj}(\omega)|$ as a dotted line and a simulated actual spectral response amplitude $|H_T(\omega)|$ as a solid line. The objective spectral response amplitude $|H_{T,obj}(\omega)|$ is obtained from the Fourier transform of the objective impulse response $h_{T,obj}(t)$. The simulated actual spectral response amplitude $|H_T(\omega)|$ is obtained from the numerical optimization process discussed below.

Figure 4B:
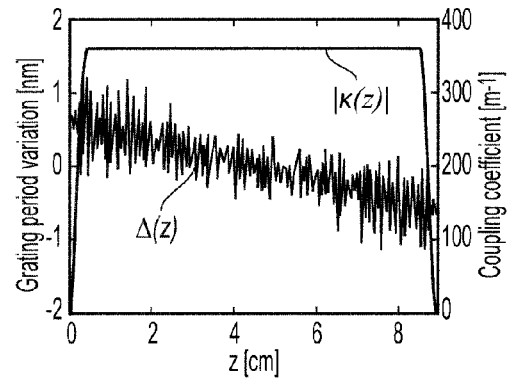

FIG. 4B shows the grating period variation $\Lambda(z)$ and the coupling coefficient $|\kappa(z)|$ for a phase-modulated FBG that exhibits the desired interference functionality. The phase-modulated FBG has a length of 9 cm, and the coupling coefficient $|\kappa(z)|$ is a raised cosine function with a roll-off factor of 10% and maximum amplitude 356.8 m$^{-1}$. The grating period variation $\Lambda(z)$ is obtained from the numerical optimization process discussed below.

Figure 4C:
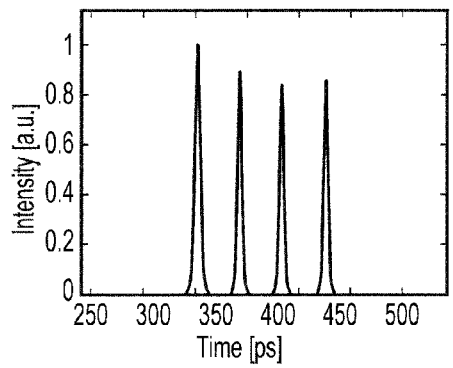

FIG. 4C shows the simulated output of the grating in response to a single 5 ps FWHM Gaussian input pulse centred on 1550 nm. It can be seen that the phase-modulated FBG acts to generate a series of four output pulses having the same profile as the input pulse.

It can be understood that the invention may be implemented with many other examples of desired interference functionality, as long as the corresponding objective impulse responses $h_{T,obj}(t)=\sum_{n=0}^{N-1}\alpha_n\delta(t-nT)$ corresponds to a minimum phase system.

Figure 5:
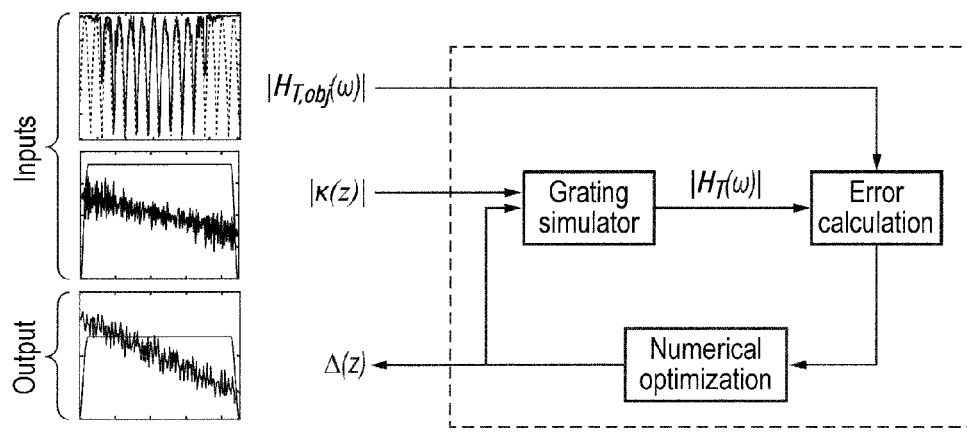
FIG. 5 is a schematic flow diagram illustrating the a numerical optimisation process for obtaining a grating period variation for use in the present invention.

FIG. 5 shows schematically a method for obtaining the grating period variation $\Lambda(z)$ based on the theory outlined above using a numerical optimisation technique. The technique is similar to a known method of obtaining grating period variation for pulse shaping purposes [6].

In the method shown in FIG. 5, the functions representing the objective spectral response amplitude $|H_{T,obj}(\omega)|$ and the coupling coefficient amplitude $|\kappa(z)|$ are provided. Although other restrictions can be specified, they need to be carefully selected, otherwise the search space can be overly reduced, excluding satisfactory solutions. Importantly, unlike the transmissive FBG synthesis algorithm proposed in [5], the phase of the spectral response in reflection is not specified, and hence a conventional inverse scattering algorithm [7] cannot be applied. In this method, a numerical optimization algorithm calculates the grating modulated phase, or equivalently the grating period variation $\Lambda(z)$, in order to obtain a simulated spectral response in transmission $|H_T(\omega)|$ that attempts to better approach the objective spectral response in transmission in terms of least minimum squares over a desired bandwidth.

In practice, an error between the simulated (calculated) spectral response $|H_T(\omega)|$ and the objective spectral response $|H_{T,obj}(\omega)|$ is determined and used to influence the selection of the next candidate grating period variation function $\Lambda_{i\pm1}(z)$ to be used in simulating the spectral response $|H_T(\omega)|$. The numerical optimisation process is arranged to reduce the error through suitable selection of a profile for the grating period variation.

A delay line interferometer according to the invention may find application in various pulse characterisation techniques, e.g. optical sampling in photonically-assisted ADC implementations, Spectral Phase Interferometry for Direct Electric-Field Reconstruction (SPIDER). Such techniques currently use conventional MZI structure. The invention may enable more compact and lower loss solutions to be obtained. Such temporal interferometry devices can also be used for several digital modulation schemes, e.g. DPSK and DQPSK demodulation (for N=2), as well as for OFDM generation and demodulation (for N>2).

REFERENCES

[1] J. H. Lim, H. S. Jang, Lee, J. C. Kim, and B. H. Lee, "Mach-Zehnder interferometer formed in a photonic crystal fiber based on a pair of long-period fiber gratings," Opt. Lett. 29, 346-348 (2004).

[2] Jiangbing Du, Yongheng Dai, Gordon K. P. Lei, Weijun Tong, and Chester Shu, "Photonic crystal fiber based Mach-Zehnder interferometer for DPSK signal demodulation," Opt. Express 18, 7917-7922 (2010)

[3] T. Allsop, R. Reeves, D. J. Webb, I. Bennion, and R. Neal, "A high sensitivity refractometer based upon a long period grating Mach-Zehnder interferometer," Review of scientific instruments, 73, 1702-1705.(2002)

[4] C. R. Liao, Y. Wang, D. N. Wang, and M. W. Yang, "Fiber in-lineMach-Zehnder interferometer embedded in FBG for simultaneous refractive index and temperature measurement," IEEE Photon. Technol. Lett., vol. 22, no. 22, pp. 1686-1688, Nov. 15, 2010.

[5] J. Skaar, J. Opt. Soc. Am. A 18, 557-564 (2001).

[6] M. A. Preciado, X. Shu, and K. Sugden, "Proposal and design of phase-modulated fiber gratings in transmission for pulse shaping," Opt. Lett. 38, 70-72 (2013).

[7] R. Feced, M. N. Zervas and M. A. Muriel, IEEE Journal of Quantum Electronics, 35, 1105-1115, (1999).

The invention claimed is:

1. A delay line interferometer, comprising:
an optical waveguide having a Bragg grating fabricated therein, the Bragg grating having a refractive index modulation with a period variation $\Lambda(z)$ along its length z that is arranged to output in transmission an output optical signal $f_{out}(t)$ in response to a input optical signal $f_{in}(t)$, wherein the output optical signal $f_{out}(t)$ is the result of temporal interference between one or more time-delayed replicas of the input optical signal $f_{in}(t)$,
wherein the optical waveguide is an optical fibre and the Bragg grating is a fibre Bragg grating (FBG), the FBG being a phase-modulated FBG and having a substantially uniform coupling strength amplitude $|\kappa(z)|$ along its length.

2. The delay line interferometer according to claim 1, wherein the optical waveguide is arranged to support the propagation of optical radiation between an input portion for receiving the input optical signal $f_{in}(t)$ and an output portion for transmitting the output optical signal $f_{out}(t)$, wherein the Bragg grating is fabricated in the optical waveguide between the input portion and the output portion.

3. The delay line interferometer according to claim 1, wherein the optical fibre comprises:
- a core having a first refractive index, and
- a cladding layer surrounding the core, the cladding layer having a second refractive index, the second refractive index being lower than the first refractive index, and
- wherein the FBG comprises a refractive index modulation inscribed within the core.

4. The delay line interferometer according to claim 3, wherein the refractive index modulation is confined within the core.

5. A delay line interferometer according to claim 1, wherein the spectral response $|H_T(\omega)|$ of the phase-modulated FBG substantially corresponds to a Fourier transform of an objective impulse response $h_{T,obj}(t)$ of the phase-modulated FBG, where the objective impulse response corresponds to a minimum phase system.

6. The delay line interferometer according to claim 1, wherein the period variation $\Lambda(z)$ of the phase-modulated FBG is arranged to output in transmission a time-spaced series of two or more optical pulses in response to a single input pulse.

7. A method of fabricating a phase-modulated fibre Bragg grating (FBG) for a delay line interferometer, the method comprising:
- obtaining an objective spectral response $|H_{T,obj}(\omega)|$ that is a Fourier transform of an objective impulse response $h_{T,obj}(t)$ of the phase-modulated FBG, where the objective impulse response corresponds to a minimum phase system;
- selecting a coupling strength $|\kappa(z)|$ to be exhibited by the phase-modulated FBG along its length z;
- calculating a grating period variation $\Lambda(z)$ for the phase-modulated FBG using the objective spectral response $|H_{T,obj}(\omega)|$ and the coupling strength $|\kappa(z)|$; and
- inscribing a refractive index modulation having the grating period variation $\Lambda(z)$ in an optical fibre,
- whereby the phase-modulated FBG is operable in transmission to output an output optical signal $f_{out}(t)$ in response to an input optical pulse $f_{in}(t)$.

8. A method according to claim 7, wherein calculating the grating period variation $\Lambda(z)$ for the phase-modulated FBG includes performing an iterative numerical optimisation process to bring a calculated spectral response $|H_T(\omega)|$ towards the objective spectral response $|H_{T,obj}(\omega)|$.

9. A method according to claim 8, wherein the iterative numerical optimisation process includes:
- obtaining the calculated spectral response $|H_T(\omega)|$ from the coupling strength $|\kappa(z)|$ and a candidate grating period variation function $\Lambda_i(z)$,
- calculating an error between the calculated spectral response $|H_T(\omega)|$ and the objective spectral response $|H_{T,obj}(\omega)|$, and
- selecting the next candidate grating period variation function $\Lambda_{i+1}(z)$ based on the error between the calculated spectral response $|H_T(\omega)|$ and the objective spectral response $|H_{T,obj}(\omega)|$.

10. A method according to claim 7, wherein inscribing the refractive index modulation includes irradiating the optical fibre with ultraviolet radiation through a phase mask that has the grating period variation $\Lambda(z)$ encoded thereon.

11. A method according to claim 7, wherein the objective impulse response $h_{T,obj}(t)$ is $\Sigma_{n=0}^{N-1} \alpha_n \delta(t-nT)$, where $\alpha_n$ and N are selected to ensure correspondence to a minimum phase function.

12. The method according to claim 7, wherein objective impulse response is selected to correspond to a time-spaced series of two or more optical pulses in response to a single input pulse.

13. A method of fabricating a phase mask for inscribing a phase-modulated fibre Bragg grating (FBG) in an optical fibre, the method comprising:
- obtaining an objective spectral response $|H_{T,obj}(\omega)|$ that is a Fourier transform of an objective impulse response $h_{T,obj}(t)$ of the phase-modulated FBG, where the objective impulse response corresponds to a minimum phase system;
- selecting a coupling strength $|\kappa(z)|$ to be exhibited by the phase-modulated FBG along its length z;
- calculating a grating period variation $\Lambda(z)$ for the phase-modulated FBG using the objective spectral response $|H_{T,obj}(\omega)|$ and the coupling strength $|\kappa(z)|$; and
- fabricating a phase mask, whereby the grating period variation $\Lambda(z)$ is encoded across the phase mask.

* * * * *